United States Patent
Husain et al.

(10) Patent No.: US 6,303,895 B1
(45) Date of Patent: Oct. 16, 2001

(54) METHOD AND APPARATUS FOR CONTROLLING A TEMPERATURE OF A WAFER

(76) Inventors: Anwar Husain, 6310 Paseo Santa Maria, Pleasanton, CA (US) 94566; Hamid Noorbakhsh, 281 Tordo Ct., Fremont, CA (US) 94539

(*) Notice: Subject to any disclaimer, the term of this patent is extended or adjusted under 35 U.S.C. 154(b) by 37 days.

(21) Appl. No.: 09/588,122

(22) Filed: Jun. 2, 2000

Related U.S. Application Data

(62) Division of application No. 08/474,009, filed on Jun. 7, 1995, now Pat. No. 6,140,612.

(51) Int. Cl.$^7$ .................................................. B23K 10/00
(52) U.S. Cl. .............................. 219/121.4; 219/121.43; 219/121.58; 219/497; 438/660; 118/725
(58) Field of Search ........................... 219/121.4, 121.41, 219/121.43, 497, 121.58; 438/660; 165/80 C, 80 D; 156/345; 118/500, 715, 724, 725, 728

(56) References Cited

U.S. PATENT DOCUMENTS

| | | | |
|---|---|---|---|
| 4,527,620 | * 7/1985 | Pederson | 165/80 D |
| 4,542,298 | * 9/1985 | Holden | 250/443.1 |
| 4,615,755 | 10/1986 | Tracy et al. | |
| 4,680,061 | * 7/1987 | Lamont, Jr. | 250/398 |
| 4,842,683 | 6/1989 | Cheng et al. | |
| 4,949,783 | 8/1990 | Lakios et al. | |
| 4,963,713 | 10/1990 | Horiuchi et al. | |
| 4,999,320 | 3/1991 | Douglas | |
| 5,096,536 | 3/1992 | Cathey | |
| 5,103,367 | 4/1992 | Horwitz et al. | |
| 5,160,152 | 11/1992 | Toraguchi et al. | |
| 5,267,607 | * 12/1993 | Wada | 118/724 |
| 5,270,266 | 12/1993 | Hirano et al. | |
| 5,290,381 | 3/1994 | Nozawa et al. | |
| 5,320,982 | 6/1994 | Tsubone et al. | |
| 5,350,479 | 9/1994 | Collins et al. | |
| 5,556,204 | 9/1996 | Tsubone et al. | |
| 5,673,750 | 10/1997 | Tsubone et al. | |
| 5,676,205 | 10/1997 | White | |
| 5,738,751 | * 4/1998 | Camerson | 156/345 |

* cited by examiner

*Primary Examiner*—Mark Paschall

(57) ABSTRACT

A method and apparatus for controlling a temperature of a wafer during processing such as in a gas plasma or non-plasma environment wherein a wafer is positioned on a chuck. The wafer is heated and a pressurized gas is introduced into a space between the wafer and the chuck such that the pressurized gas transfers heat from the wafer to the chuck. Pressure of the pressuried gas is automatically varied such that heat transfer between the wafer and the chuck is varied in response to a difference between an actual wafer temperature and a desired wafer temperature to maintain the desired wafer temperature.

19 Claims, 3 Drawing Sheets

METHOD AND APPARATUS FOR CONTROLLING A TEMPERATURE OF A WAFER

This application is division of Ser. No. 08/474,009 filed Jun. 7,1995 U.S. Pat. No. 6,140,612.

FIELD OF THE INVENTION

The invention relates to methods and apparatus for temperature control of articles being processed during processing in, for example, CVD, PVD, or etch reactors.

BACKGROUND OF THE INVENTION

In chambers for CVD, PVD, or etching of articles, which articles are hereinafter generically referred to as wafers, it is common to support the wafer on a chuck. RF bias energy can be supplied by the chuck supporting a wafer to provide uniform electrical coupling of the bias energy through the wafer to the plasma. The wafer is also thermally coupled to the chuck to minimize the possibility of overheating of the wafer.

To overcome problems of poor thermal and electrical coupling between the wafer and the chuck in the low pressure or vacuum environment during processing, the wafer is usually clamped to the chuck by means of a mechanical clamping systems or an electrostatic chuck which employs the attractive coulomb force between oppositely charged surfaces to clamp the wafer to the chuck. Because wafer processing usually occurs in a very low pressure environment, it has been found to be desirable to introduce a gas such as, for example, helium, hydrogen, or nitrogen between the wafer and the chuck to enhance thermal contact and heat transfer. U.S. Pat. Nos. 5,103,367, 5,160,152, and 5,350,479, for example, disclose the use of a gas between the wafer and the chuck for improving thermal transfer. Such chucks typically have cooling jackets for cooling a wafer through thermal contact with the chuck. In addition, co-pending U.S. patent application Ser. No. 08/401,524 discloses an electrostatic chuck having heater electrodes provided therein that can be used to compensate for plasma non-uniformity and/or edge effects and to provide temperature control during processing.

It has proven difficult to accurately monitor wafer temperatures during processing and, accordingly, control of wafer temperature suffers. Infrared pyrometers are not suited for measuring wafer temperatures below 300° C due to transparency of the silicon wafers at such temperatures. Spring loaded contact probes with phosphor applied on them have been used to contact back sides of wafers for in-situ backside wafer temperature measurements, but this technique has not proven to be reliable in a production environment. It is, accordingly, desirable to provide a method and apparatus for reliably monitoring and controlling wafer temperature during processing.

SUMMARY OF THE INVENTION

According to one aspect of the present invention, a method of controlling a temperature of a wafer during processing is provided. According to the method, a wafer is positioned on a chuck and the wafer is heated. A pressurized gas is introduced into a space between the wafer and the chuck such that the pressurized gas transfers heat from the wafer to the chuck. Pressure of the pressurized gas is automatically varied such that heat transfer between the wafer and the chuck is varied in response to a difference between an actual wafer temperature and a desired wafer temperature to maintain the desired wafer temperature.

In accordance with another aspect of the present invention, an apparatus for controlling a temperature of a wafer during processing, includes a chuck on which a wafer is mountable. A gas supply passage is provided through which pressurized gas is introduced into a space between the wafer and the chuck. A gas pressure adjuster is provided for automatically varying pressure of the gas between the wafer and the chuck such that heat transfer between the wafer and the chuck is varied in response to a difference between an actual wafer temperature and a desired wafer temperature to maintain the desired wafer temperature.

BRIEF DESCRIPTION OF THE DRAWINGS

The features and advantages of the present invention are well understood by reading the following detailed description in conjunction with the drawings in which like numerals indicate similar elements and in which.

DETAILED DESCRIPTION OF THE PREFERRED EMBODIMENTS

Figure 1:
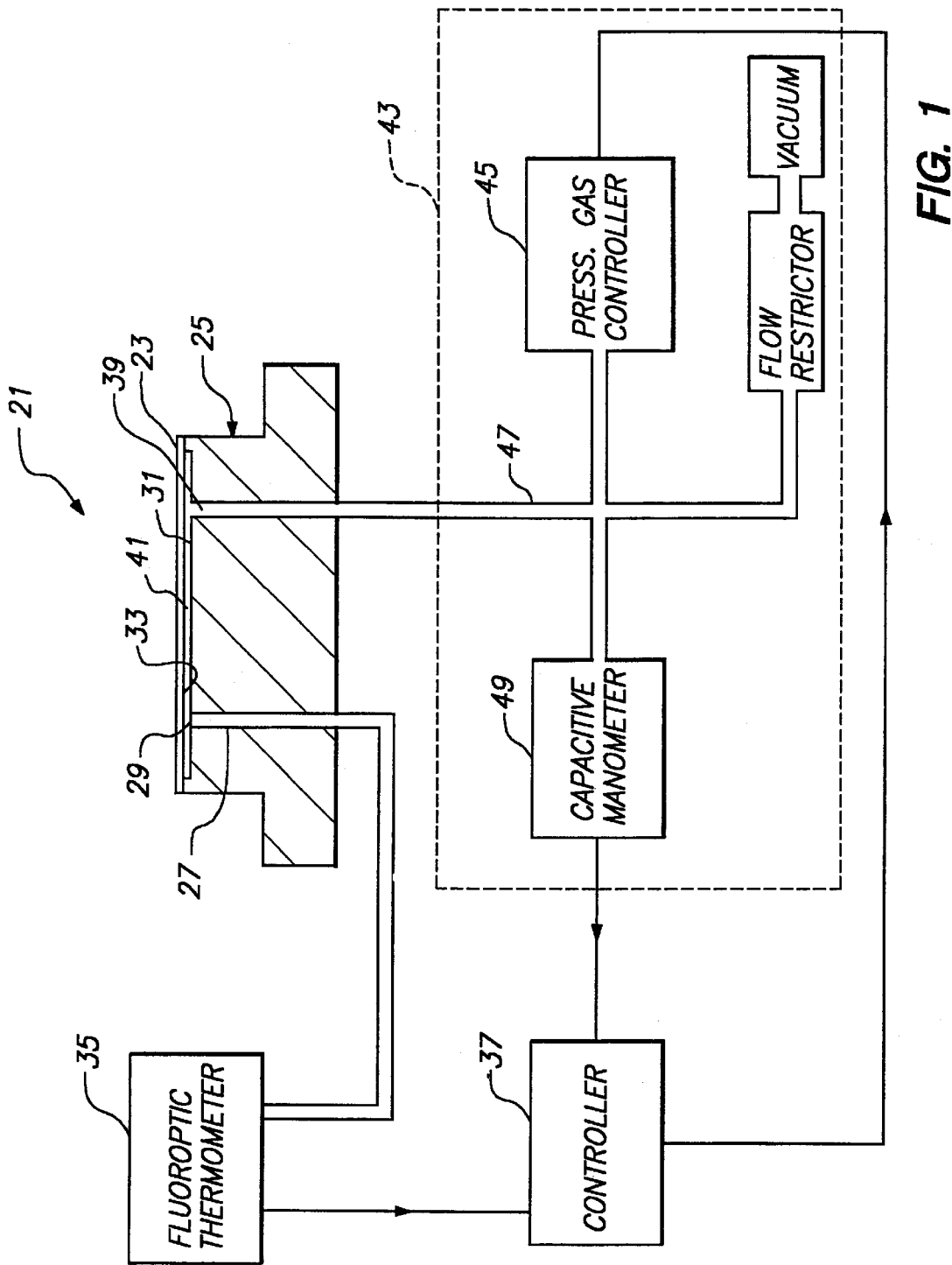
FIG. 1 is a schematic view of an apparatus for controlling the temperature of a wafer according to an embodiment of the present invention.

An apparatus 21 according to the present invention for controlling temperature of a wafer 23 during processing in a gas plasma or non-plasma processing system in, for example, a CVD, PVD, or etch reactor of an otherwise conventional type is seen with reference to FIG. 1. The apparatus 21 preferably includes an electrostatic chuck 25 having at least one very low mass, non-contact blackbody probe 27 mounted thereon for monitoring wafer temperature. However, chucks having mechanical clamping systems may also be used according to the present invention. The following discussion assumes that the chuck 25 primarily acts as a heat sink in the processing apparatus. However, as discussed below, the chuck 25 may be an electrostatic chuck as disclosed in co-pending U.S. patent application Ser. No. 08/401,524, which is hereby incorporated by reference, having heating elements therein such that the chuck may heat the wafer.

The probe 27 is preferably in the form of a very small fiber, on the order of approximately 340$\mu$m in diameter, having a phosphorous doped tip 29 at substantially the surface 31 of the chuck 25. Alternatively, probe 27 could be formed with an aluminum, tungsten or other thermally emissive material incorporated in the tip. The tip 29 of the probe 27 is preferably disposed within 5mils of the backside 33 of the wafer 23 so as to avoid contact with the wafer when the wafer is positioned on the chuck 25 during processing. The tip 29 temperature $T_p$ is preferably measured by a temperature sensor of a fluoroptic thermometer unit 35, such as the Luxtron Fluoroptic Thermometer, available from Luxtron Corp., Santa Clara, Calif., by means of a signal transmitted through a standard light pipe. The fluoroptic unit 35 sends a temperature signal corresponding to the temperature of the tip 29 to a controller 37, such as the 900 EPC Series Eurotherm Controller, available from Eurotherm Controls, Ltd., Faraday Close, Durrington Worthing West Sussex, England.

The chuck 25 further includes a gas supply passage 39 in its surface 31 through which pressurized gas, preferably helium, may be introduced into a space 41 between the chuck surface and the backside 33 of the wafer. The space 41 can be formed by a pattern of shallow grooves in the chuck surface. The gas is pressurized in the space 41 by means of a gas pressure adjuster 43 including a pressurized gas controller 45 for delivering pressurized gas to a line 47 leading to the space and connected to a capacitive manometer head 49, preferably a 50 torr head, in the line for sending a pressure signal corresponding to the pressure in the space to the controller 37. The Model 5866RT Pressure Controller, available from Brooks Instrument, Hatfield, Pa., is suitable for use as the pressurized gas controller.

As discussed further below, the controller 37 is preferably pre-programmed for processing one or more types of wafers with different backside treatments, e.g., standard, semi-polished, heavily-doped, or oxidized, and generates a pressure output signal for controlling the pressurized gas controller 45 such that the pressure of gas in the space 41 is adjusted. The pressure output signal is a function of the variables including wafer type, and the temperature and pressure signals. By raising the pressure of the gas in the space 41, heat transfer between the wafer 23 and the chuck 25 is increased and, conversely, by lowering the pressure of the gas in the space, heat transfer between the wafer and the chuck is decreased.

The apparatus 21 is preferably operated at pressures in the space 41 of between 2 and 25 torr and, in this range, lowering the pressure permits raising the temperature of the wafer 23 because less heat is transferred to the chuck 25 acting as a heat sink while raising the pressure causes lowering of the temperature of the wafer because more heat is transferred to the chuck. Ordinarily, of course, it is desired to maintain a substantially constant wafer temperature during processing. However, minor temperature variations in the wafer can be expected to occur as temperatures and pressures are constantly monitored and controlled.

Figure 2:
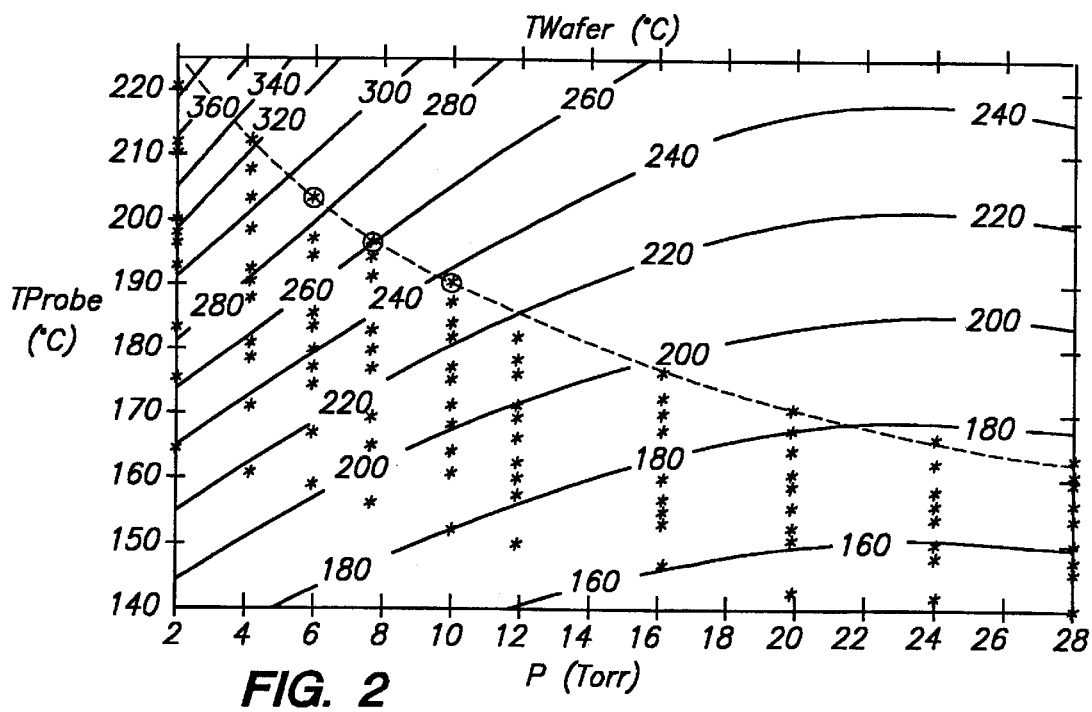
FIG. 2 is a graphic illustration of a calibration equation according to the present invention.

The controller 37 is preferably pre-programmed for generating the pressure output signal by calibrating the apparatus 21 using phosphorous dot wafers at different gas pressures and RF power levels or heat input to generate a quadratic calibration equation for the particular type of wafer. As seen in FIG. 2, which graphically illustrates the calibration equation and plots actual temperatures at the tip 29 of the probe 27 as functions of helium pressure in the space 41 and temperatures of the phosphorous dot wafers, a correlation between the temperature at the tip of the probe and the temperature of the phosphorous dot wafers in an apparatus according to the present invention can be observed.

FIG. 2 shows calibration data for various wafer types at different heat inputs in a particular apparatus, the chuck surface being maintained at a substantially constant temperature in the particular processing environment. For the wafer type and thermal input represented by the uppermost calibration curve (shown in dotted lines), when helium pressure is measured at 8 torr, and probe tip temperature is measured at approximately 200° C, the actual temperature of the wafer should be approximately 260° C. If pressure is increased to 10 torr, heat transfer between the wafer and the chuck improves, the temperature measured at the tip of the probe drops to approximately 190° C, and the actual temperature of the wafer should drop to approximately 235° C. If pressure is decreased to 6 torr, heat transfer between the wafer and the chuck decreases, the temperature measured at the tip of the probe is approximately 205° C, and the temperature of the wafer should rise to approximately 285° C. Changes to processing parameters such as desired wafer temperatures are preferably entered into the controller 37 by conventional means such as a keyboard or control panel.

Figure 3:
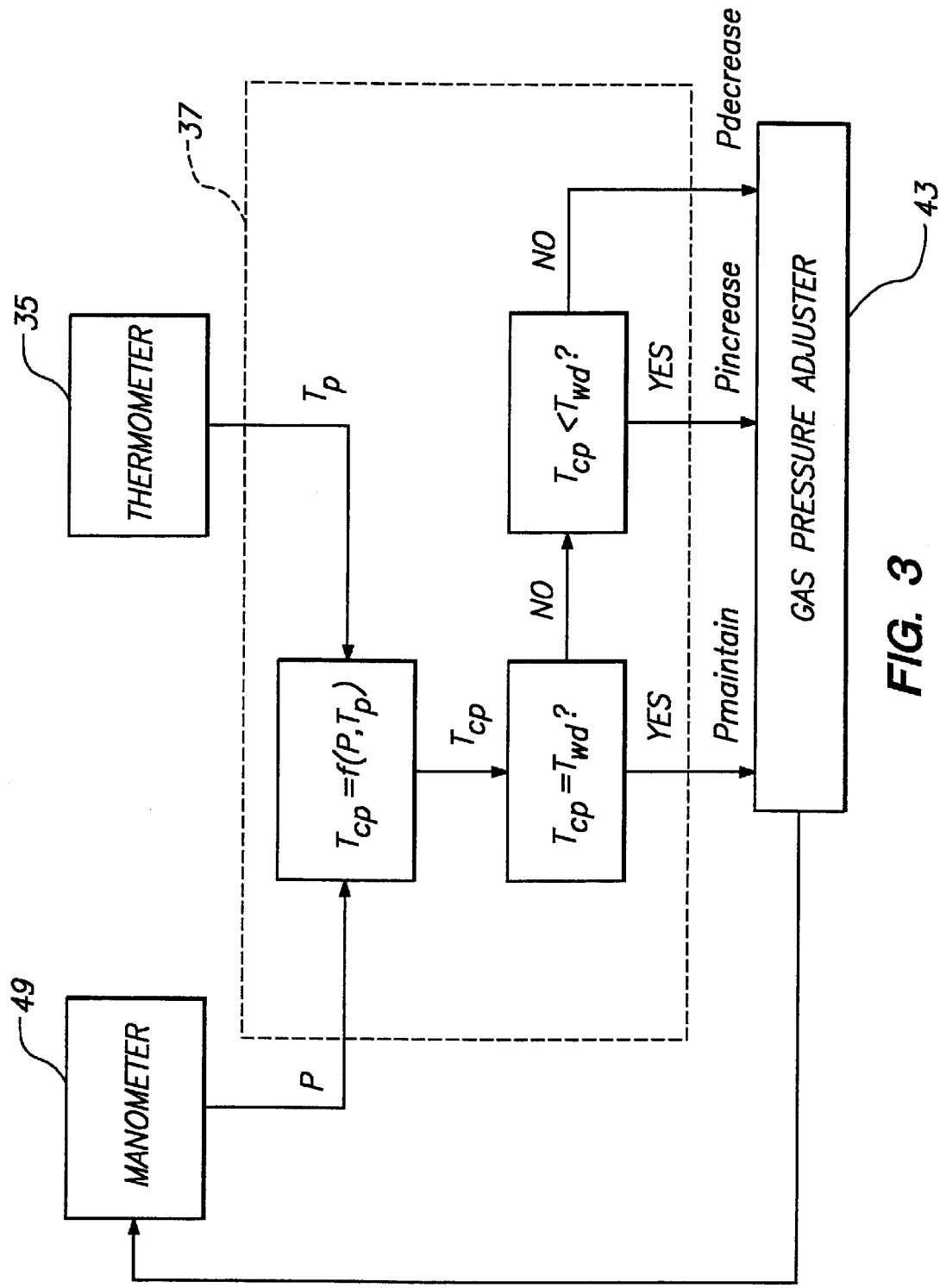
FIG. 3 is a flow diagram showing steps in a temperature monitoring and controlling system according to the present invention.

Accordingly, when the temperature at the tip 29 of the probe 27 and pressure in the space 41 are known, the temperature of a wafer being treated in the wafer processing system can be determined by a calibration equation derived from the data shown in FIG. 2. The calibration equation is preferably programmed into the controller 37 for constant monitoring and controlling of the wafer temperature as measured by the probe 27. As seen in the highly simplified flow diagram shown in FIG. 3, a signal corresponding to the actual temperature $T_p$ of the tip 29 measured by the thermometer and a signal corresponding to the pressure P measured by the manometer 49 are transmitted to the controller 37. The controller 37 determines a temperature $T_{cp}$ of the wafer 23 as measured by the probe and corrected by the calibration equation, hereinafter referred to as corrected probe temperature.

The controller 37 then compares $T_{cp}$ to a desired or set-point or predetermined temperature $T_{wp}$ of the wafer for the processing operation. If $T_{wd}$ and $T_{cp}$ are equal, the controller 37 controls the pressure controller 45 such that pressure P is maintained, such as by sending a signal to maintain pressure constant or by sending no signal. If $T_{wd}$ is greater than $T_{cp}$, the controller 37 sends a signal to the pressure controller 45 to cause the pressure to decrease relative to the measured pressure P whereby thermal conductivity between the wafer and chuck decreases and the wafer temperature rises. If $T_{wd}$ is less than $T_{cp}$, the controller 37 sends a signal to the pressure controller 45 to cause the pressure to increase relative to the measured pressure P whereby thermal conductivity between the wafer and chuck increases and the wafer temperature is lowered. Thus, the pressure of the gas in the space 41 is automatically varied such that heat transfer between the wafer 23 and the chuck 25 is varied in response to a difference between $T_{cp}$ and $T_{wd}$. As noted above, if pressure increases or decreases, heat transfer between the chuck 25 and the wafer 23 will increase or decrease, respectively, permitting lowering or raising of the corrected probe temperature $T_{cp}$, respectively, at least over the range of pressures in which the apparatus according to the present invention is preferably operated, i.e., approximately 2 to 25 torr. At pressures below 2 torr, the heat transfer medium between the wafer and the chuck does not appear to be a significant factor in thermal transfer between the chuck and the wafer.

When processing of the wafer 23 is initiated, i.e, during a preheat phase of operation, there is preferably little or no gas introduced into the space 41, thus minimizing heat transfer to the chuck 25 and ensuring that the wafer is quickly heated to its desired temperature $T_{wd}$. Whether the wafer is at its desired temperature $T_{wd}$ is preferably initially determined by determining the length of time that a corresponding phosphorous dot wafer requires to reach the desired temperature. All subsequent corresponding wafers, i.e., corresponding non-phosphorous dot wafers, are then preferably preheated for the same length of time that it took for the phosphorous dot wafer to reach the desired temperature $T_{wd}$. Preheating is preferably accomplished with RF energy for between 5 and 20 seconds. Gas pressure in the space during preheating is preferably between 0 and 2 torr.

Figure 4:
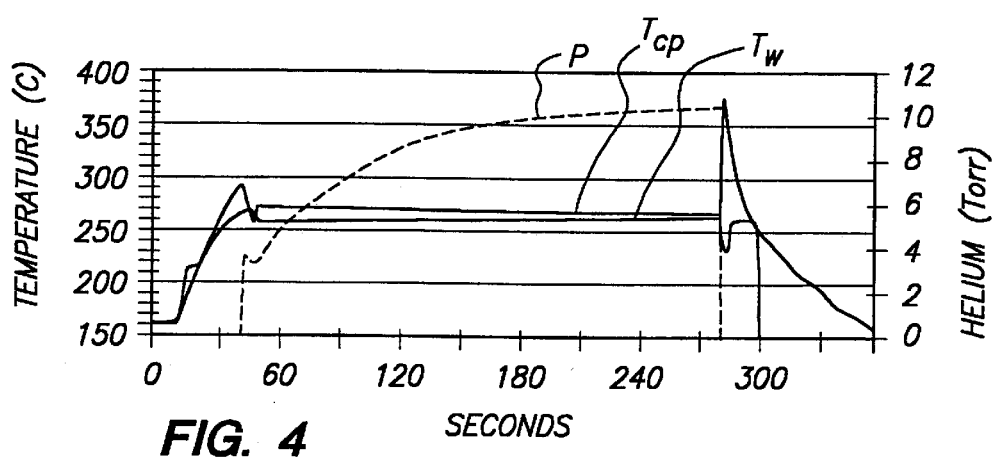
FIG. 4 is a graphic illustration of wafer temperature, pressure change, and probe temperature according to the present invention.

After the wafer 23 has been preheated to substantially its desired temperature $T_{wd}$, gas pressure in the space 41 is raised and continually monitored and automatically adjusted to improve thermal transfer between the chuck 25 and the wafer and thereby maintain the wafer at its desired temperature in the particular environment in which it is being processed. If the wafer 23 is maintained at its desired temperature $T_{wd}$ as pressure is raised, the actual wafer temperature, which is substantially equal to the corrected probe temperature $T_{cp}$, follows the contour line corresponding to that temperature in the graphic illustration in FIG. 2 of the calibration equation, and the actual probe temperature $T_p$ rises. FIG. 4 plots actual wafer temperature $T_w$, i.e., of a phosphorous dot wafer, corrected probe temperature $T_{cp}$, as corrected by the calibration equation, and pressure P over time as pressure is raised from 0 to approximately 10 torr, at which point, for the particular environment, there is substantial equilibrium between heat transferred to the wafer from the environment and heat transferred from the wafer to the chuck. It will be appreciated that if, for some reason, the temperature of the wafer as measured by the probe, i.e., the corrected probe temperature $T_{cp}$ of the wafer, should drop below or rise above the desired wafer temperature $T_{wd}$ unexpectedly, the apparatus 21 lowers or raises the temperature of the wafer automatically by virtue of the constant input of temperature and pressure signals to the controller, which constantly outputs pressure signals to the pressurized gas controller 45.

It will be observed from FIG. 4 that, initially, there is a quick increase in pressure, followed by pressure increase at a decreasing rate, followed by a substantial equilibrium state in which pressure P, wafer temperature, and corrected probe temperature $T_{cp}$ remain substantially constant. It will further be observed that actual wafer temperature is quite closely approximated by the corrected probe temperature $T_{cp}$ as pressure rises above approximately 2 torr. Corrected probe temperatures have been observed to be accurate to within 5° C above 6 torr helium pressure. For optimal temperature control, pressures in the space are preferably maintained above 4 torr. Temperatures of the wafer are preferably maintained at between 250° C and 400° C.

Figure 5:
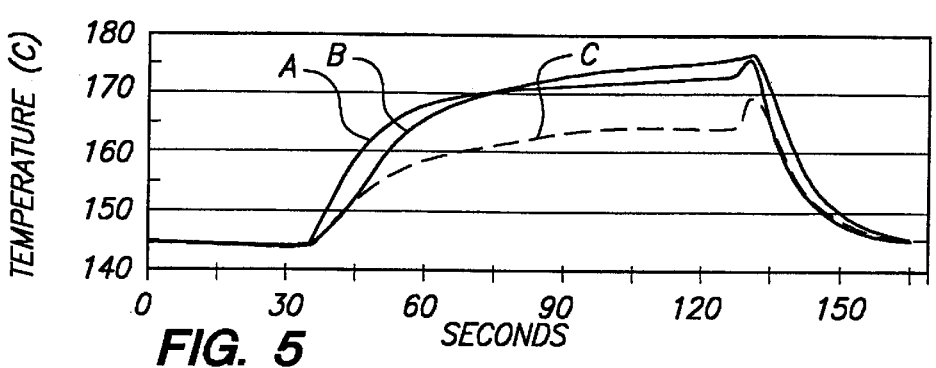
FIG. 5 is a graphic illustration of probe response time for different types of temperature probes according to the present invention.

The actual probe temperature $T_p$, and, accordingly, the corrected probe temperature $T_{cp}$, tend to lag slightly behind actual wafer temperature $T_w$, largely due to factors such as probe mass and heat conduction of the fiber or light pipe that transmits the probe temperature signal to the controller. The probe material according to one embodiment of the invention, is silica for providing an extra clear probe. However, silica tends to etch when exposed to $NF_3$ plasma and should not be exposed to such plasma repeatedly. Accordingly, it is desirable to cover the chuck 25 with a wafer during in situ cleaning to prevent damage to the probe. Temperature response time of several types of probe materials is shown in FIG. 5, line A showing the response time for a 340μm sputtered tip silica fiber probe, line B showing the response time for a 340μm doped phosphorous tip silica fiber probe, and line C showing the response time for an 800μm sputtered tip silica fiber probe. The 340μm sputtered top silica fiber probe was observed to have the fastest response time.

The foregoing description has assumed that the chuck 25 acts as a heat sink to the wafer 23. As noted above, however, the wafer 23 may be heated by resistance heating in the chuck in accordance with another embodiment of the present invention. Again, pressure increases in the space 41 will enhance heat transfer between the wafer and the chuck and pressure decreases will decrease heat transfer. However, when pressure is increased or decreased in accordance with this embodiment of the invention, since heat energy is transferred to the wafer from the chuck, instead of from the wafer to the chuck, actual wafer temperature can be increased or decreased, respectively, in an opposite manner from that described earlier in the embodiment of the invention wherein the chuck acts as a heat sink. The chuck having heating elements may, of course, function as a heat sink during a portion of the processing operation.

The foregoing has described the principles, preferred embodiments, and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A method of controlling a temperature of a wafer during processing, comprising steps of:
   positioning a wafer on a chuck;
   heating the wafer;
   introducing a pressurized gas into a space between the wafer and the chuck such that the pressurized gas transfers heat from the wafer to the chuck;
   measuring a temperature of the wafer, and
   automatically varying pressure of the pressurized gas such that heat transfer between the wafer and the chuck is varied in response to a difference between an actual wafer temperature and a desired wafer temperature to maintain the desired wafer temperature.

2. The method as set forth in claim 1, wherein the temperature of the wafer is measured by a temperature sensor measuring a temperature at the underside of the wafer. the gas pressure being adjusted in response to the measured wafer temperature, the temperature sensor including a temperature probe which measures a temperature in a gas filled space beneath the wafer, the method further including using a controller to determine the actual wafer temperature based on the temperature measured by the probe and pressure of the gas in the space.

3. The method as set forth in claim 2, comprising measuring a pressure of the gas between the wafer and the chuck and maintaining the desired wafer temperature by increasing the pressure of the gas between the wafer and the chuck with respect to the measured pressure when the measured wafer temperature rises above the desired wafer temperature and by decreasing the pressure of the gas with respect to the measured pressure when the measured wafer temperature falls below the desired wafer temperature.

4. The method as set forth in claim 1, further comprising preheating the wafer in a plasma environment adjacent the wafer while maintaining an absence of gas pressure between the wafer and the chuck.

5. The method as set forth in claim 1, further comprising preheating the wafer by resistance heating.

6. The method as set forth in claim 1, further comprising preheating the wafer while providing a gas pressure of between 0 and 2 torr between the wafer and the chuck.

7. The method as set forth in claim 1, wherein, during the automatic pressure varying step, pressure of the gas is varied from between 2 and 25 torr.

8. The method as set forth in claim 7, wherein, during the automatic pressure varying step, the pressure of the gas is maintained above 4 torr.

9. The method as set forth in claim 1, wherein, during the automatic pressure varying step, temperature of the wafer is maintained at between 250° C and 400° C.

10. The method as set forth in claim 1, comprising the further step of changing wafer temperature to a second desired wafer temperature by varying the pressure of the gas.

11. The method as set forth in claim 10, wherein wafer temperature is increased to the second desired wafer temperature by reducing pressure of the gas.

12. An apparatus for controlling a temperature of a wafer during processing, comprising:
- a chuck on which a wafer is mountable;
- a gas supply passage through which pressurized gas is introduced into a space between the wafer and the chuck; and
- a gas pressure adjuster for automatically varying pressure of the gas between the wafer and the chuck such that heat transfer between the wafer and the chuck is varied in response to a difference between an actual wafer temperature and a desired wafer temperature to maintain the desired wafer temperature.

13. The apparatus as set forth in claim 12, further comprising a temperature sensor, the temperature sensor measuring a temperature of the wafer, the gas pressure adjuster varying pressure in response to the measured wafer temperature.

14. The apparatus as set forth in claim 13, further comprising a pressure sensor, the pressure sensor measuring a pressure of the gas between the wafer and the chuck, wherein the gas pressure adjuster maintains the desired wafer temperature by increasing the pressure of the gas with respect to a pressure measured by the pressure sensor when the measured wafer temperature rises above the desired wafer temperature and by decreasing the pressure of the gas with respect to the pressure measured by the pressure sensor when the measured wafer temperature falls below the desired wafer temperature.

15. The apparatus as set forth in claim 13, wherein the wafer temperature sensor includes a non-contact probe which does not physically contact the wafer.

16. The apparatus as set forth in claim 12, wherein the gas pressure adjuster maintains the desired wafer temperature over a range of gas pressures in the space between 2 and 25 torr.

17. The apparatus as set forth in claim 12, wherein the apparatus maintains desired wafer temperatures in the range between 250° C and 400° C.

18. The apparatus as set forth in claim 12, wherein the chuck includes an electrostatic clamping mechanism for electrostatically clamping the wafer on the chuck.

19. The apparatus as set forth in claim 12, wherein the apparatus forms part of a plasma reaction chamber.

* * * * *

UNITED STATES PATENT AND TRADEMARK OFFICE
CERTIFICATE OF CORRECTION

| | | |
|---|---|---|
| PATENT NO. | : 6,303,895 B1 | Page 1 of 1 |
| APPLICATION NO. | : 09/588122 | |
| DATED | : October 16, 2001 | |
| INVENTOR(S) | : Anwar Husain et al. | |

It is certified that error appears in the above-identified patent and that said Letters Patent is hereby corrected as shown below:

Title Page, the following should be inserted:

--(73) Assignee: Lam Research Corporation, Fremont, CA (US)--.

Signed and Sealed this

Eighteenth Day of August, 2009

David J. Kappos
*Director of the United States Patent and Trademark Office*